United States Patent [19]

Edwards et al.

[11] Patent Number: 5,881,944
[45] Date of Patent: Mar. 16, 1999

[54] MULTI-LAYER SOLDER SEAL BAND FOR SEMICONDUCTOR SUBSTRATES

[75] Inventors: David L. Edwards, Poughkeepsie; Armando S. Cammarano, Hyde Park; Jeffrey T. Coffin, Pleasant Valley; Mark G. Courtney, Poughkeepsie; Stephen S. Drofitz, Jr., Wappingers Falls; Michael J. Ellsworth, Jr., Poughkeepsie; Lewis S. Goldmann, Bedford; Sushumna Iruvanti, Wappingers Falls; Frank L. Pompeo, Montgomery; William E. Sablinski, Beacon; Raed A. Sherif, Croton; Hilton T. Toy, Wappingers Falls, all of N.Y.

[73] Assignee: International Business Machines Corporation, Armonk, N.Y.

[21] Appl. No.: 846,929

[22] Filed: Apr. 30, 1997

[51] Int. Cl.⁶ .............................. B23K 31/02; B23K 35/22
[52] U.S. Cl. ........................................... 228/56.3; 428/596
[58] Field of Search ................................ 228/56.3, 124.6, 228/246, 208; 428/596, 617, 643, 645, 646; 257/704; 174/52.4

[56] References Cited

U.S. PATENT DOCUMENTS

| | | | |
|---|---|---|---|
| 4,020,987 | 5/1977 | Hascoe | 228/56 |
| 4,322,737 | 3/1982 | Sliwa, Jr. | 357/82 |
| 4,500,945 | 2/1985 | Lipschutz | 361/386 |
| 4,640,438 | 2/1987 | Trevison et al. | 228/193 |
| 4,746,583 | 5/1988 | Falanga | 428/632 |
| 5,153,709 | 10/1992 | Fukuoka | 357/71 |
| 5,244,143 | 9/1993 | Ference et al. | 228/180.21 |
| 5,248,250 | 9/1993 | Adachi | 425/547 |
| 5,275,549 | 1/1994 | Yamasaki | 425/546 |
| 5,329,160 | 7/1994 | Miura et al. | 257/710 |
| 5,380,184 | 1/1995 | Von Holdt, Sr. | 425/547 |
| 5,395,226 | 3/1995 | Sakai et al. | 425/116 |
| 5,414,300 | 5/1995 | Tozawa et al. | 257/704 |
| 5,471,027 | 11/1995 | Call et al. | 219/85.13 |
| 5,523,260 | 6/1996 | Missele | 437/209 |

*Primary Examiner*—Samuel M. Heinrich
*Attorney, Agent, or Firm*—Aziz M. Ahsan

[57] ABSTRACT

The present invention relates generally to a new scheme of providing a seal band for semi-conductor substrates and chip carriers. More particularly, the invention encompasses a structure and a method that uses a multi-layer metallic seal to provide protection to chips on a chip carrier. This multi-layer metal seal provides both enhanced hermeticity lifetime and environmental protection. For the preferred embodiment the multi-layer metallic seal band is a three layer, solder sandwich structure which is used to create a low cost, high reliability, hermetic seal for the module. This solder sandwich has a high melting temperature thick solder inner core, and lower melting point thin interconnecting solder layers, where the thin interconnecting solder layers may have similar or different melting points.

21 Claims, 2 Drawing Sheets

MULTI-LAYER SOLDER SEAL BAND FOR SEMICONDUCTOR SUBSTRATES

CROSS-REFERENCE TO RELATED PATENT APPLICATION

This Patent Application is related to U.S. patent application Ser. No. 08/346,935, filed on Apr. 30, 1997, Attorney Docket No. FI9-95-174, entitled "MULTI-LAYER SOLDER SEAL BAND FOR SEMICONDUCTOR SUBSTRATES AND PROCESS THEREOF", assigned to the assignee of the instant Patent Application, and the disclosure of which is incorporated herein by reference.

FIELD OF THE INVENTION

The present invention relates generally to a new scheme of providing a seal for semi-conductor substrates and chip carriers. More particularly, the invention encompasses a structure and a method that uses a multi-layer metallic seal to provide protection to chips on a chip carrier. This multi-layer metal seal provides both chip fatigue life enhancement and environmental protection.

For the preferred embodiment the multi-layer metallic seal is a three layer, solder sandwich structure which is used to create a low cost, high reliability, hermetic seal for the module. This solder sandwich has a high melting temperature thick solder inner core, and lower melting point thin solder layers on both sides of the thick solder inner core, where the thin solder layers may have similar or different melting points.

BACKGROUND OF THE INVENTION

Semiconductor devices are becoming smaller and more dense with the evolution of new technology. However, increases in chip circuit density produce a corresponding emphasis on overall chip packaging strategies in order to remain competitive. Chip and chip carrier manufacturers are therefore constantly being challenged to improve the quality of their products by identifying and eliminating problems, reducing package size and weight, decreasing package costs, providing improved thermal efficiencies and fabricating better and more advanced chips. Whereas significant improvements are being made to eliminate systematic problems by reducing process variability, process improvements alone are not sufficient to eliminate all the problems which effect both performance and reliability.

One way to provide a high level of environmental protection for a package is to have a hermetic seal. Of course, preserving module reworkability is a cost advantage, especially for multi-chip modules (MCMs).

One method to obtain a reworkable hermetic seal is by using a solder seal. For traditional solder seal packages to be reliable, it is necessary for modules to use expansion matched components, that is, that when the module is powered on, the expansion of the cap at the seal closely matches the expansion of the substrate at the seal. In early solder seal packages, chip powers were low, and the module was fairly isothermal, so expansions were matched by matching the cap's thermal coefficient of expansion (TCE) to the substrate's TCE. This was often done using the same material for both substrate and cap or cover. In this manner, ceramic substrates were often sealed to ceramic caps. The seal was very reliable, but the cap was very expensive.

In some applications, the thermal conductivity of ceramic caps is not sufficient, but most materials that have sufficiently high thermal conductivity also have TCE's that are too high for seal reliability requirements.

As module powers have risen, modules are no longer isothermal, and in some applications, the substrate temperatures during use are significantly higher than the cap temperatures. In order for these modules to have matched amounts of expansion at the solder seal, the components have to have different TCE's. The optimum TCE of the cap is a function of the substrate TCE and the module thermal gradients during use. TCE selection is application specific, and this contributes to a high cap cost.

U.S. Pat. No. 4,020,987 (Hascoe) discloses an alloy core having upper and lower thin alloy coatings, which is punched to form a solder preform ring for use in hermetically sealing a container. During reflow all of the solder layers melt and mix together to form a homogeneous seal band.

U.S. Pat. No. 4,291,815 (Gordon, et al.) discloses a ceramic lid assembly which includes an integral heat fusible layer defining a hermetic sealing area provided around the periphery of the ceramic lid for hermetic sealing of semiconductor chips in a flat pack.

U.S. Pat. No. 4,746,583 (Falanga) discloses a ceramic combined cover, where a solder layer in the form of a pre-cut gold-tin solder frame is tack welded onto a gold layer. The gold layer is readily wettable by the solder layer and is also extremely corrosion resistant.

U.S. Pat. No. 5,153,709 (Fukuoka) teaches the joining of a cap to a ceramic substrate using a connection conductor pattern, an annular inorganic insulation layer, an annular metallized layer and eutectic solder.

U.S. Pat. No. 5,244,143 (Ference, et al.) assigned to the assignee of the instant patent application and the disclosure of which is incorporated herein by reference, describes an apparatus and method for injection molding solder mounds onto electronic devices.

U.S. Pat. No. 5,329,160 (Miura) discloses a low-melting brazing metal separated by a gap-creating spacer which is used in joining a cover to a ceramic substrate having sealing metallized portions.

U.S. Pat. No. 5,471,027 (Call, et al.), discloses a method for forming a chip carrier with a single protective encapsulant. He specifically teaches the use of a picture-frame type area, which is only on the top surface and away from the edges of the substrate, to seal the cap or cover or heat sink to the substrate using a cap sealant.

U.S. patent application Ser. No. 08/561,571, filed on Nov. 21, 1995 (Braun, et al.), assigned to the assignee of the instant patent application and the disclosure of which is incorporated herein by reference, describes an apparatus and method for forming mold for metallic material, where the metallic interconnections in a mold can be used to form structures, such as, for example, solder connections, heat sinks with fins, etc.

U.S. patent application Ser. No. 08/562,079, filed on Nov. 21, 1995 (Covell, et al.), assigned to the assignee of the instant patent application and the disclosure of which is incorporated herein by reference, describes a mold transfer apparatus and method, where the metallic connections made in the mold can also be used to form structures, such as, for example, heat sinks with fins, etc.

Therefore, one way to maintain hermetic seal reliability, maintain reworkability, decrease cost and improve package thermal performance, would be to develop a new solder seal that can accommodate greater mismatches in expansions between the cap and the substrate during use.

PURPOSES AND SUMMARY OF THE INVENTION

The invention is a novel scheme to provide a multi-layered metallic seal for semiconductor substrates and method thereof.

Therefore, one purpose of this invention is to provide a multi-layered metallic seal for hermetically sealing semiconductor substrates to caps having different amounts of thermal expansion at the seal.

Another purpose of this invention is to provide a multi-layered solder seal for semiconductor substrates.

Still another purpose of this invention is to have a multi-layered solder seal for semiconductor substrates, where at least one layer of the solder seal is thick having a high melting point temperature and at least two layers of solder seal that are thin and have lower melting point temperatures.

Another purpose of this invention is to provide for a fluid-tight seal.

Still another purpose of this invention is to have a hermetic seal.

Therefore, in one aspect this invention comprises a solder seal band to provide a hermetic seal between a cover and a semiconductor substrate, said seal band comprising a high melting point solder core sandwiched between at least one first solder interconnection layer and at least one second interconnection solder layer, wherein said first and said second solder interconnection layers are made from lower melting point solder materials than said high melting point solder core, and wherein upon reflow said first and/or said second solder interconnection layer do not integrate into said high melting point solder core.

In another aspect this invention comprises a process for forming a hermetic seal band between a cover and a semiconductor substrate, comprising the steps of:

(a) forming at least one solder preform band, where said solder preform band comprises of at least one first solder layer secured to one side of at least one high temperature solder core, and at least one second solder layer secured to the other side of said at least one high temperature solder core, (b) placing said solder preform band between said semiconductor substrate and said cover to form a sub-assembly, and (c) placing said sub-assembly in a thermal environment and reflowing said first and said second solder layers without reflowing said solder core layer such that a hermetic seal band is formed between said substrate and said cover.

In yet another aspect this invention comprises a process for forming a hermetic seal band between a cover and a semiconductor substrate, comprising the steps of:

(a) securing at least one first solder layer to said substrate, and forming a first sub-assembly, (b) securing at least one second solder layer to said cover, and forming a second sub-assembly, (c) placing at least one high temperature solder core preform between said first sub-assembly and said second sub-assembly, such that said first solder layer and said second solder layer sandwich said solder core, to form a third sub-assembly, (d) placing said third sub-assembly in a thermal environment and reflowing said first and said second solder layers without reflowing said solder core layer such that a hermetic seal band is formed between said substrate and said cover.

In still yet another aspect this invention comprises a process for forming a hermetic seal band between a cover and a semiconductor substrate, comprising the steps of:

(a) forming at least one solder preform band, where said solder preform band comprises of at least one first solder layer secured to one side of at least one high temperature solder core, (b) securing said solder preform band to said cover such that said first solder layer is in direct contact with said cover, (c) securing at least one second solder layer to the perimeter surface of said substrate, (d) placing said semiconductor substrate and said cover to form a sub-assembly, such that said solder core is in direct contact with said second layer, (e) placing said sub-assembly in a thermal environment and reflowing said first and said second solder layers without ref lowing said solder core layer such that a hermetic seal band is formed between said substrate and said cover.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

When a semiconductor module is powered the heat generated by the semiconductor elements causes the substrate and cap to heat. The amount that each component heats up combined with that component's thermal coefficient of expansion determines how much the component expands. Any difference between the expansion of the substrate and the expansion of the cap causes a strain in the seal (that attaches the cap to the substrate). The strain in the seal is proportional to the difference in expansions, and inversely proportional to the thickness of that seal. The current invention is a novel seal structure that is stable, reliable, and much thicker than traditional solder seals, and is therefore able to accommodate many times as much expansion mismatch between a cap and the substrate as traditional solder seals.

IBM's multilayered ceramic (MLC) electronic packages are among the most technically advanced electronic packages in the industry; however some of the high function modules require expensive components. This invention describes one way to reduce the cost of such packages without any loss or degradation of their performance. Packaging methods which reduce costs, advantageously increase the availability of such electronic packages in the marketplace. As a person skilled in the art knows, increased packaging density is typically achieved by greater utilization of the surface area or real estate of the substrate or module.

Figure 1:
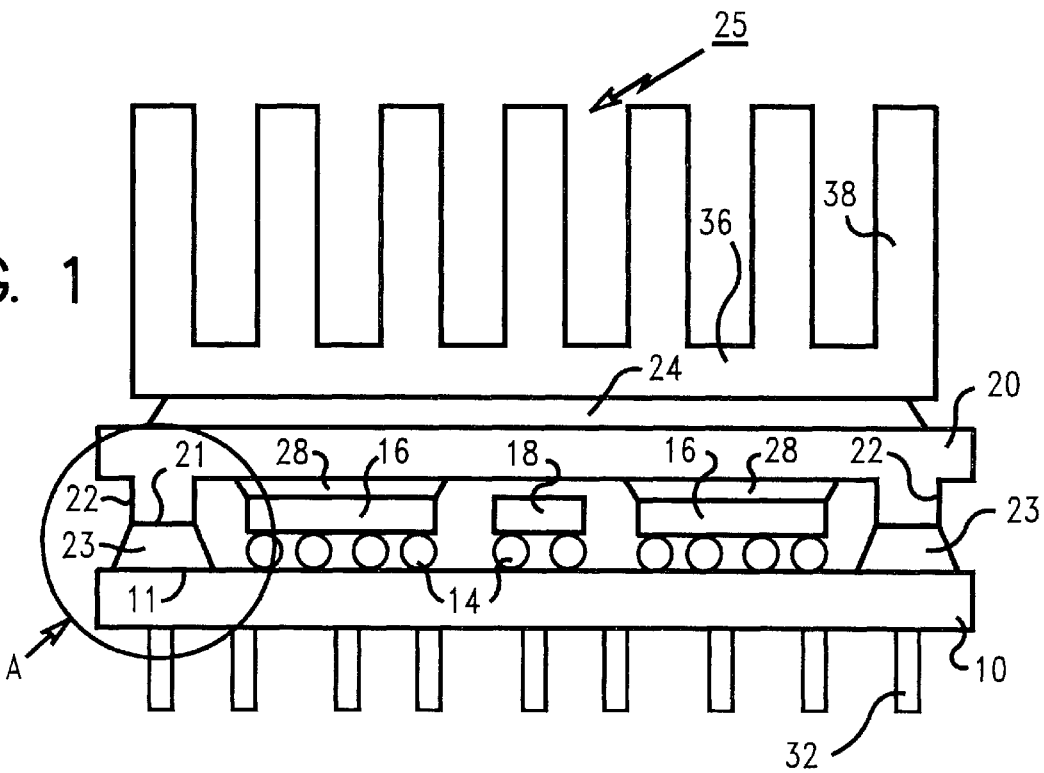
FIG. 1, illustrates a preferred embodiment of this invention, where a cover has been secured to a semiconductor substrate using the solder seal band of this invention to form a semiconductor module.
Figure 2:
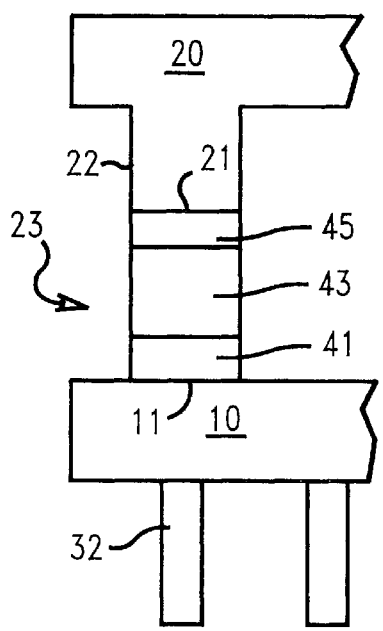
FIG. 2, illustrates an enlarged view of the corner "A" as shown in FIG. 1.

FIGS. 1 and 2, illustrate a preferred embodiment of an assembled module 25, of this invention. Typically, at least one chip 16, is first secured to a substrate or module 10, via a plurality of solder connections 14, such as, solder balls 14. The substrate 10, could also have one or more electrical device(s) 18, such as, for example, a decoupling capacitor 18, that is also electrically connected to the substrate 10, via solder connections 14, such as, solder balls 14. An optional thermally conductive material 28, may be applied over the exposed surface of the chip 16, such that a direct thermal contact is made between the chip 16, and a cap or cover 20, when the cover 20, is placed over to cover and protect the electronic elements, such as, chip 16, decoupling capacitors 18, solder connections 14, etc. A cap sealant or solder seal 23, is then provided, in order to secure the cap or cover 20, to the substrate or module 10.

The material for the substrate 10, is typically selected from a group comprising alumina, alumina with glass frits, aluminum nitride, borosilicate, ceramic, glass ceramic, to name a few.

The material for the cap or cover 20, is typically selected from a group comprising alumina, aluminum, aluminum nitride, composites of aluminum and silicon carbide, copper, copper-tungsten, cuvar (invar impregnated with copper), silvar (invar impregnated with silver) and alloys thereof, to name a few.

Semiconductor elements, such as, chips 16, decoupling capacitors 18, to name a few, are typically electrically connected to the substrate 10, and wherein the electrical connection is normally selected from a group comprising of solder ball, solder column, low-melting point solder, high-melting point solder, pin, wire, to name a few.

The substrate 10, is typically secured to a board or card (not shown) via electrical I/O (Input/Output) means 32, such as, for example, pins 32.

An optional heat removing device 36, such as a heat sink or heat spreader 36, can be secured to the cover 20, such as, by using adhesive 24. However, other mechanical means, such as, a double-sided adhesive tape, one or more clip, to name a few, could be used to attach the heat sink 36, to the cap 20. The heat sink 36, could also have one or more heat fins 38.

As stated earlier, the optional thermal compound 28, may be placed between the chip 16, and the cap 20, to provide an efficient heat transfer path via the heat sink adhesive 24, to the (optional) heat removing device 36.

Figure 3:
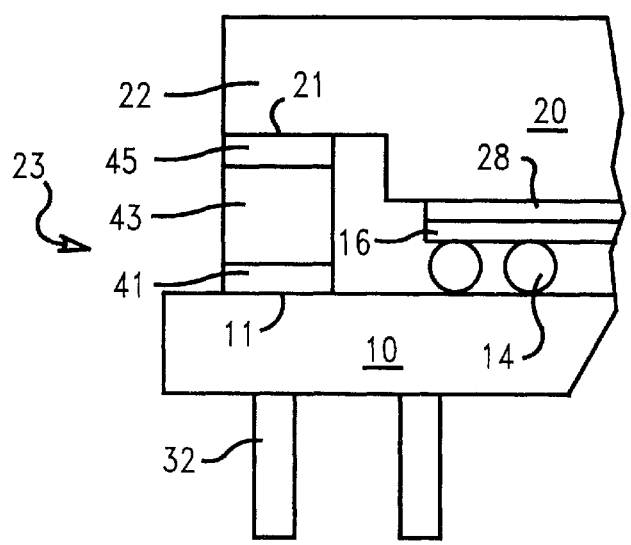
FIG. 3, illustrates an enlarged view of a corner of another preferred embodiment of this invention.

FIG. 3, illustrates an enlarged view of a corner of another preferred embodiment of this invention. As shown in FIG. 3, the cap 20, has an extension 22, having surface area 21, to accommodate the cap solder seal 23.

Now referring back to FIGS. 1, 2 and 3, a picture-frame type area 11, is provided on the peripheral edges of the surface of the substrate 10. A similar picture-frame type area 21, is also provided on the peripheral edges of the surface of the cap or cover 20. The inventive solder seal 23, is then used to secure the area 11, to area 21, such that the cap 20, is hermetically sealed to the substrate 10.

For wettability to the solder, this picture-frame area 21 and 11, on the cap 20, and substrate 10, respectively, is plated with a solderable layer, for example, a layer of gold over a layer of nickel. This frame shaped solder wettable surface 11 and 21, is typically between about 1.5 mm to about 2.5 mm wide.

Therefore the placement of all devices, such as, for example, chips 16, decoupling capacitors 18, etc., must be restricted to be within this picture frame area 11, which is typically less than 80 percent of the substrate 10, top surface area.

The cap or cover 20, is typically of a metal or a ceramic or a composite material and in most cases it is permanently secured to the upper or top surface of the substrate 10. This is done primarily to prevent mechanical and chemical injury to the electrical features on the substrate 10, such as, for example, chip 16, solder balls 14, decoupling capacitors 18, and any exposed metallurgy or circuitry on the substrate 10. It is well known that a leak in the cap 20, or in the cap solder seal 23, or any misalignment of the cap 20, could result in module yield losses. These losses could be substantial for an expensive module 10.

The inventive solder seal 23, basically comprises of at least one thick solder core 43, that has at least one first solder layer 41, and at least one second solder layer 45, on each side of the core 43. The thick solder core 43, has a different chemical composition than the first layer 41, and the second solder layer 45, such that the melting point of the thick solder core 43, is higher than either of the interconnecting solder layers 45 and 41. In this manner, the first and second solder layers 41 and 45, are reflowed for attachment of the cap 20, to the substrate 10, without melting or distorting the thick solder core 43.

For some applications the first solder layer 41, and the second solder layer 45, may be of the same composition (and therefore have the same melting point) to facilitate simultaneous joining of the cap 20, to the substrate 10.

For another application, all three layers of the solder seal 23, namely, solder layers 41, 43 and 45, have different melting points. For example, the melting point of the first solder layer 41, could be lower than the melting point of the second solder layer 45, and both solder layers 41 and 45, have melting points lower than the melting point of the solder core layer 43. This scheme could be used to facilitate a more serial attachment of the solder preform 23, to form the module 25.

If this scheme is used, the solder preform 23, could be attached to the solder wettable area 21, on the cap 20, by reflowing the layer 45, without melting the core layer 43. Then the cap 20, with attached solder preform 23, could be attached to the solder wettable area 11, on the substrate 10, by reflowing the solder layer 41, without reflowing either the thick core 43, or the solder layer 45. This procedure is expected to have higher manufacturing yields because the solder to cap joint can be established and verified prior to attachment to the substrate 10. This also facilitates module rework, because if only the solder interconnection layer 41, is reflowed during cap removal, solder interconnecting layer 45, and the thick solder core 43, will remain attached to the cap 20. This reduces the amount of effort needed to dress the solder wettable area 11, on the substrate 10, prior to re-capping.

The inventive solder seal structure 23, requires a temperature hierarchy where the solder seal 23, comprises of the thick core layer 43, that has a melting point that is higher than the melting points of both of the outer interconnecting layers 41 and 45. In order for this structure to be feasible to build in volume, there must also be a sufficient margin between these melting points, such that the solid core 43, does not melt or significantly soften during interconnection to the cap 20, and substrate 10. With commonly used joining equipment, a margin of 50° C. or greater in melting points between the thick solder core 43, and the solder layers 41 and 45, has been found adequate. Conceivably, advances in furnace or oven technology could reduce this margin. Thus, in the preferred embodiment, the thick core solder layer 43, is selected from a range of materials such that the melting point is at least 50° C. higher than the melting points of both solder interconnection layers 41 and 45.

For example, the thick core solder layer 43, may be selected from Lead/Tin, Lead/Indium, High Tin/Bismuth or low Tin/Bismuth solder materials.

For the Lead/Tin solder material 43, it is preferred that Lead is in the range of about 60 to about 100 percent by weight, with the balance being Tin and any other impurities.

For the Lead/Indium solder material 43, it is preferred that Lead is in the range of about 70 to about 100 percent by weight, with the balance being Indium and any other impurities.

For the High Tin/Bismuth solder material 43, it is preferred that Tin is in the range of about 77 to about 100 percent by weight, with the balance being Bismuth and any other impurities.

For the Low Tin/Bismuth solder material 43, it is preferred that Tin is in the range of about 0 to about 20 percent by weight, with the balance being Bismuth and any other impurities.

Each of the thinner or outer solder interconnection layers 41 and 45, may be selected from Lead/Tin, Lead/Indium or Tin-Bismuth solder materials.

For the Lead/Tin solder material 41 and/or 45, it is preferred that Lead is in the range of about 0 to about 40 percent by weight, with the balance being Tin and any other impurities.

For the Lead/Indium solder material 41 and/or 45, it is preferred that Lead is in the range of about 30 to about 60 percent by weight, with the balance being Indium and any other impurities.

For the Tin/Bismuth solder material 41 and/or 45, it is preferred that Tin is in the range of about 37 to about 48 percent by weight, with the balance being Bismuth and any other impurities.

Using the above solder material ratios by weight, a module designer will appreciate that the interconnecting layers 41 and/or 45, and the solder core 43, can be produced from different ratios of the same elements (as PbSn), or that the interconnecting layers and the core can be produced from using different, yet compatible materials, such as PbIn interconnecting layers with a PbSn core, or SnBi interconnecting layers with a PbSn core. The two interconnection solder layers 41 and 45, could be made from the same or different alloys.

However, it should be clear to one skilled in the art that solders from other systems could also be used for either the core layer 43, or the solder layers 41 and/or 45, to provide the necessary temperature hierarchy and inter-layer compatibility. These solders may include, but not limited to, indium/silver, tin/antimony, tin/silver, or alloys thereof, to name a few.

Some of the solder materials listed above could also have as much as 2 percent copper as well, or trace quantities of other elements.

It is obvious to a skilled metallurgist that the selection of some materials for use as the inner core 43, will reduce the potential list of interconnecting layers 41 and 45, in order to maintain the 50° C. difference in melting temperatures, as well as to use compatible materials.

The thickness of the solder core 43, can be used to fix the thickness of the final solder joint, or the joint thickness can be larger, by using a standoff of greater height, and having the thickness of the interconnecting layers make up the difference.

Another way to achieve the desired solder gap is to make the design gap thickness equal to the sum of:

(a) the thickness of standoffs contained in the upper or second solder interconnecting layer 45, (b) the thickness of the core solder 43, and (c) the thickness of standoffs contained in the lower or first solder interconnecting layer 41.

In this manner, the preferred solder joint thickness of about 1.0 mm may be achieved with a thickness of about 0.8 mm for the thick core solder 43, and then both interconnection layers 41 and 45, having internal standoffs of about 0.1 mm.

Figure 4:
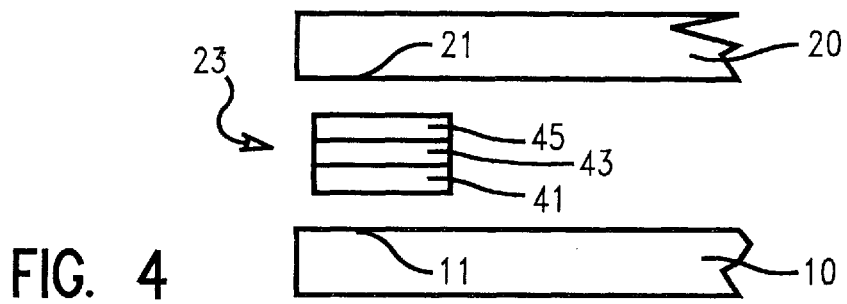
FIG. 4, illustrates one method of making the preferred embodiment of this invention using a preformed solder seal band.

FIG. 4, illustrates one method of making the preferred embodiment of this invention. Basically, the cap sealant or solder seal 23, is first formed by methods well known in the art. For example, one could first form the thick solder core 43. Then at least one first solder layer 41, and at least one second solder layer 45, would be formed on each side of the thick solder core 43, resulting in the solder seal structure 23. The solder seal 23, would then be placed at the desired location, such as, area 21, on the cap 20, and area 11, on the substrate 10, and this assembly would then be placed in a thermal environment in order to reflow the first and second solder layers 41 and 45. After reflow and upon cooling a hermetic seal is formed between the substrate 10, and the cap 20, and forming the module 25.

Figure 5:
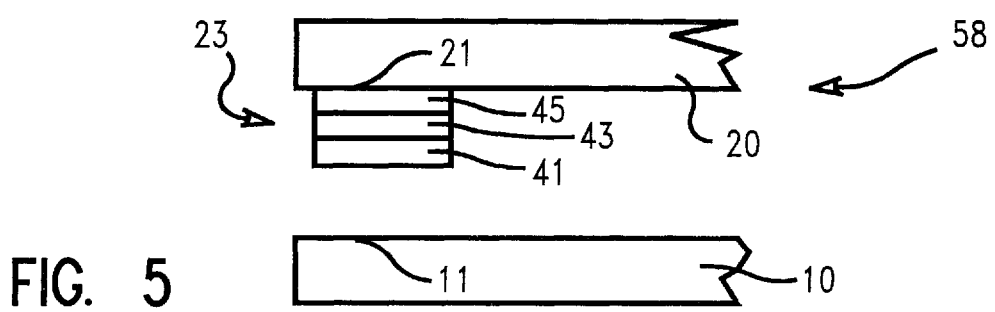
FIG. 5, illustrates another method of making the preferred embodiment of this invention, where a preformed solder seal band is first secured to a cover.

FIG. 5, illustrates another method of making the preferred embodiment of this invention. In this embodiment the solder seal 23, is formed by any of the methods of the prior art. The solder seal is first placed over the desired sealing location 21, on the cap 20, and this sub-assembly is placed in a thermal environment so that the thin solder layer 45, reflows and adheres to both the solder core 43, and the cap 20, and forms a sub-assembly 58. This sub-assembly 58, is then placed over the substrate 10, such that area 11, is in contact with at least a portion of the first solder layer 41. This assembly is then reflowed and upon cooling a hermetic seal is formed between the substrate 10, and the cap 20, and forming the module 25.

Figure 6:
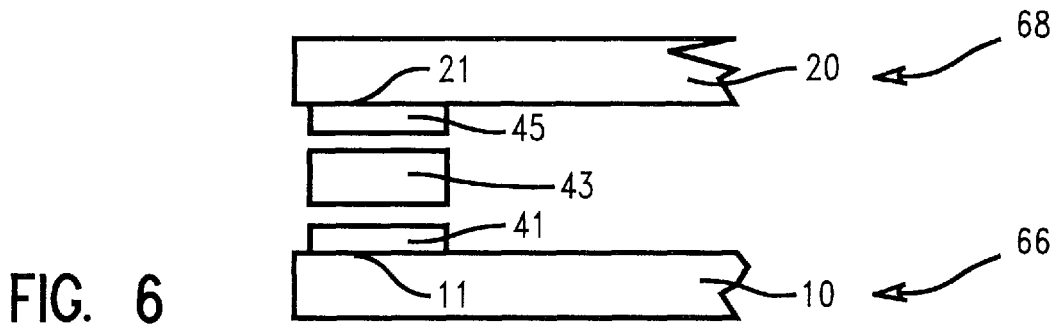
FIG. 6, illustrates yet another method of making the preferred embodiment of this invention.

FIG. 6, illustrates yet another method of making the preferred embodiment of this invention. In this process a thin layer of first solder layer 41, is placed on at least a portion of area 11, on the substrate 10, and reflowed to form sub-assembly 66. A thin layer of a second solder layer 45, is placed on at least a portion of area 21, on the cap 20, and reflowed to form sub-assembly 68. A thick solder core 43, is then placed between the sub-assemblies 66 and 68, such that, at least a portion of solder layers 41 and 45, are in physical contact with the core layer 43. This assembly is then reflowed and upon cooling a hermetic seal is formed between the substrate 10, and the cap 20, and forming the module 25.

Figure 7:
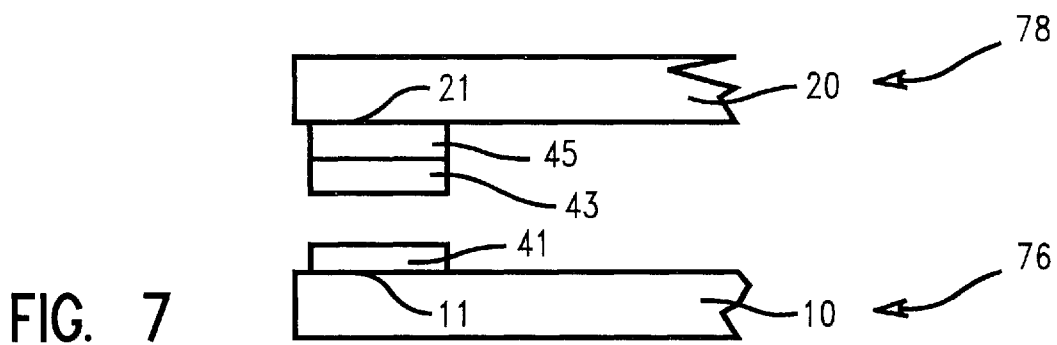
FIG. 7, illustrates still another method of making the preferred embodiment of this invention.

FIG. 7, illustrates still another method of making the preferred embodiment of this invention. In this process a thin layer of first solder layer 41, is placed on at least a portion of area 11, on the substrate 10, and reflowed to form sub-assembly 76. A thin layer of a second solder layer 45, is preferably first secured to the thick solder core 43, by any of the known processes as discussed elsewhere in the specification. This sub-assembly is then placed on the cap 20, such that, at least a portion of the area 21, is in direct physical contact with at least a portion of the second solder layer 45, and reflowed to form sub-assembly 78. However, for some applications the second solder layer 45, and the thick solder core 43, could be formed separately and then attached to the cap 20, by reflowing layer 45, to form the sub-assembly 78. These two sub-assemblies 76 and 78, are then placed together, such that, solder layers 41 and 43, are in physical contact with each other. This assembly is then reflowed and upon cooling a hermetic seal is formed between the substrate 10, and the cap 20, and forming the module 25.

There are a number of ways of forming the cap sealant or solder seal 23.

The invented solder structure 23, can be created in several ways. In one embodiment, the solder preform 23, consists of Just the thick solder core 43. The preform is then attached to the cap 20, and substrate 10, by using either pre-tinned components, or separate preforms 41 and 45, of the interconnection layers on the substrate 10, and the cap 20.

In another embodiment, the solder preform 23, consists of the thick solder core 43, and one of the interconnection layers 41 or 45. The preform is attached to the area 21, of the cap 20, or area 11, of the substrate 10, by reflowing the interconnection layer 45 or 41, to one of the components 20 and 10, and attaching the thick core to the other component by either reflowing a separate thin preform 41 or 45, or using a pre-tinned component.

In one preferred embodiment, the preform 23, has all three solder layers, the top interconnection layer 45, the thick core 43, and the bottom interconnection layer 41. It can be attached to both components 10 or 20, simultaneously, or to the substrate 10, before attachment to the cap 20, or preferably to the cap 20, first and then to the substrate 10.

In another preferred embodiment, the second or upper solder layer 45, has a higher melting point than the lower or first solder layer 41. To maintain high manufacturing throughput, high manufacturing yields, and to produce a robust solder joint, the solders used in the three different layers are selected such that the melting point of the top interconnection layer 45, is higher than the melting point of the bottom interconnection later 41, and that the thick core solder 43, has a melting point which is at least 50° C. higher than the melting point of the upper interconnecting solder layer 45.

The manufacturing process to seal modules 25, for one of the preferred embodiment can be as follows;

(a) attach solder preform to the ledge 22, of the cap 20, by reflowing top interconnection layer 45, (b) attach the cap 20, with attached preform 23, to the substrate 10, by reflowing the lower interconnection solder layer 41, (c) leak test module for required level of hermeticity.

For example, for a two layer preform 23, one would start with a sandwich preform having core 43, and layer 45. The cap 20, and the substrate 10, both have picture frame areas of solder wettable surface 21 and 11, respectively. The solder wettable surfaces are areas which are wettable by solder, for example, an area with gold plating over nickel.

The two layer preform 23, is then attached to the solder wettable area 21, of the cap 20, by fluxing the cap 20, and laying the two layer preform 23, on the cap 20. Care should be taken that the low melt interconnection layer 45, is in secure contact with the solder wettable area 21. This partial assembly is then placed inside a furnace and the layer 45, is then reflowed. However, it should be understood that the core 43, is not reflowed. After the reflow the cap/preform combined structure is then cleaned to take away any flux residue.

The solder wettable substrate surface area 11, can then be pre-tinned by fluxing the picture frame type surface area 11, and then placing a separate thin layer of low melt solder 41, on the frame area 11, and reflowing the solder 41. Any flux residue can then be cleaned by methods well known in the art.

The cap 20, with the preform 23, can then be assembled onto the pre-tinned substrate area 11, by assembling the two into a fixture that holds the cap 20, and the substrate 10, together under light pressure, and the substrate interconnection layer 41 (without any flux), is then reflowed in an oxygen deficient, or otherwise inert environment. Care should be taken that the core layer 43, is not reflowed during this process. The assembled module 25, can now be tested for any fluid leaks.

For a three layer preform 23, one could start with a sandwich preform having layers 41 and 45, sandwiching the core layer 43. Picture frame areas 21 and 11, of solder wettable surface (i.e. gold plating over nickel), are formed on the cap 20, and substrate 10, respectively. The cap 20, is then joined to the substrate 10, using the preform 23, by stacking them into a fixture that holds them together under light pressure. The interconnection layers 41 and 45 (without the flux), are then reflowed, in an oxygen deficient, or otherwise inert environment. Again care should be taken that the solder core 43, is not reflowed during this joining process. The assembled module 25, can now be tested for any leaks.

For a three layer preform 23, a second process could be used. Here one would start with a preform having outer layers 41 and 45, which sandwich the core layer 43. The cap 20, and substrate 10, are provided with picture frame areas of solder wettable surface (i.e. gold plating over nickel) 21 and 11, respectively. The preform 23, is then attached to the cap 20, by fluxing the cap 20, and by laying the preform 23, on the cap 20. The solder interconnection layer 45 (but not the thick core 43), is then reflowed, and the area or combined structure is then cleaned to take away any remaining flux residue. The cap 20, having the preform 23, is then assembled onto the substrate 10, by assembling the two into a fixture that holds the two together under light pressure. The substrate interconnection layer 41 (without the flux), (but not the core layer 43) is then reflowed in an oxygen deficient or otherwise inert environment. The assembled module 25, can now be tested for any leaks.

However, for some applications one could start with the thick core preform 43, of only high melt solder 43. A solder wettable surface (i.e. gold plating over nickel), is then created on the cap 20, and the substrate 10, in a picture frame pattern in the region 21 and 11, respectively. The thick high melt preform 43, and a separate low melt preform 45, are then attached to the cap 20, by fluxing the cap 20, and then reflowing the interconnection layer 45 (but not the core 43), and then cleaning away the flux residue. The substrate 10, in the region 11, is then pre-tinned by fluxing the picture frame surface, and a separate thin layer of low melt solder 41, is then placed. The solder 41, and then reflowed and the flux residue is then cleaned away. The cap 20, with the preform core 43 and 45, is then assembled on to the pre-tinned substrate 10, by assembling the two into a fixture that holds the two together under light pressure, and reflowing the interconnection layer 41 (without flux) (but not reflowing the core layer 43) in an oxygen deficient or otherwise inert environment. The assembled module 25, can now be tested for any leaks.

It should be clear to one skilled in the art that for the embodiments illustrated in FIGS. 5 and 7, the core layer 43, may be first attached to the substrate 10, rather than to the cap or cover 20.

This new solder structure has several cost and reliability advantages. This is because the new thick solder structure 23 (comprising layers 45/43/41), has the ability to accommodate a greater range of expansion mismatches between the cap 20, and the substrate 10. One potential savings is that cap TCE selection can become less product specific, which can reduce the number of required designs, and be subject to price volume discounts.

Another potential savings is that since a greater range in expansions can be accommodated, cap TCE tolerances can be increased significantly, reducing cap costs. The greatest expected cost benefit is that less expensive cap materials, with less optimum TCE properties can now be used as materials for the cap 20.

Another benefit is that this solder structure 23 (comprising the metal layers 45/43/41), may be incorporated into existing designs for significant extensions in seal reliability.

Another performance advantage is that this invention can allow the module designer the option of using caps with higher thermal conductivities, for reduced chip operating temperatures, and therefore longer module life.

The advantages of an electronic package or module such as the one disclosed in this patent application are many. Such as, the cost of the package may be reduced by (a) opening up the TCE tolerance on caps, and/or (b) use of less expensive cap materials.

Furthermore, this invention provides a higher performance option for some packages, because ceramic caps may be replaced with caps of higher thermal conductivity, reducing chip operating temperatures.

The structure and process of this invention offer several advantages over prior art. For example, it allows use of caps which have higher thermal conductivity, i.e., WCu, AlSiC, composites of Cu & Invar, CuVar, SilVar, to name a few, and/or lower cost. As a direct replacement for existing solder seal packages, it provides a significant improvement in seal reliability.

Another advantage of the present invention is that the option for module reworkability is maintained, which keeps the cost of scrap losses down.

EXAMPLE

The following example is intended to further illustrate the invention and is not intended to limit the scope of the invention in any manner.

Example 1

With the current invention, the new solder seal results in a cap 20, to substrate 10, separation of about 0.3 mm to about 2.0 mm, and typically about 1.0 mm.

A solder interconnection structure of this invention was assembled, having a temperature hierarchy consistent with the preferred embodiment. The top interconnection layer 45, had about 96.5 percent Sn with about 3.5 percent Ag, creating the melting point of the layer 45, to be about 221° C. The thick core layer 43, had about 90 percent Pb and 10 percent Sn, which created a melting point of about 300° C. for core layer 43. The bottom interconnection layer 41, had about 63 percent Sn and about 37 percent Pb which created a melting point of about 183° C. for the layer 41. The module 25, was then leak tested and it was shown to be hermetic.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A solder seal band to provide a hermetic seal between a cover and a semiconductor substrate, said seal band comprising a high melting point solder core sandwiched between at least one first solder interconnection layer and at least one second interconnection solder layer, wherein said first and said second solder interconnection layers are made from lower melting point solder materials than said high melting point solder core, and wherein upon reflow said first and/or said second solder interconnection layer do not integrate into said high melting point solder core.

2. The seal band of claim 1, wherein the melting point temperature difference between said high melting point solder core and said at least one first and/or second solder interconnection layer is at least about 50° C.

3. The seal band of claim 1, wherein said first and said second solder interconnection layers have the same melting point.

4. The seal band of claim 1, wherein said first and said second solder interconnection layers have different melting points.

5. The seal band of claim 1, wherein said first solder interconnection layer has a lower melting point than said second solder interconnection layer.

6. The seal band of claim 1, wherein material for said at least one first and/or second solder layer is selected from a group consisting of lead/tin, lead/indium, tin/bismuth, indium/silver, tin/antimony, tin/silver, and alloys thereof.

7. The seal band of claim 1, wherein said first and/or second solder interconnection layer is of a lead/tin material, and wherein said lead is in the range of about 0 to about 40 percent by weight.

8. The seal band of claim 1, wherein said first and/or second solder interconnection layer is of a lead/indium material, and wherein said lead is in the range of about 30 to about 60 percent by weight.

9. The seal band of claim 1, wherein said first and/or second solder interconnection layer is of a tin/bismuth material, and wherein said tin is in the range of about 37 to about 48 percent by weight.

10. The seal band of claim 1, wherein said first and/or second solder interconnection layer is a mixture having up to about 2 percent content by weight of copper or alloy thereof.

11. The seal band of claim 1, wherein material for said high melting point solder core is selected from a group consisting of lead/tin, lead/indium, tin/bismuth, indium/silver, tin/antimony, tin/silver, and alloys thereof.

12. The seal band of claim 1, wherein said high melting point solder core is of a lead/tin material, and wherein said lead is in the range of about 60 to about 100 percent by weight.

13. The seal band of claim 1, wherein said high melting point solder core is of a lead/indium material, and wherein said lead is in the range of about 70 to about 100 percent by weight.

14. The seal band of claim 1, wherein said high melting point solder core is of a tin/bismuth material, and wherein said tin is in the range of about 77 to about 100 percent by weight.

15. The seal band of claim 1, wherein said high melting point solder core is of a tin/bismuth material, and wherein said tin is in the range of about 0 to about 20 percent by weight.

16. The seal band of claim 1, wherein said high melting point solder core is an alloy having up to about 2 percent content by weight of copper or alloy thereof.

17. The seal band of claim 1, wherein at least one heat removing device is secured to said cover.

18. The seal band of claim 1, wherein material for said substrate is selected from a group consisting of alumina, alumina with glass frits, aluminum nitride, borosilicate, ceramic and glass ceramic.

19. The seal band of claim 1, wherein at least one electrical connection is secured to said substrate, and wherein said electrical connection is selected from a group consisting of solder ball, solder column, low-melting point solder, high-melting point solder, pin or wire.

20. The seal band of claim 1, wherein at least one electrical element is secured to said substrate, and wherein said electrical element is selected from a group consisting of semiconductor chip or decoupling capacitor.

21. The seal band of claim 1, wherein material for said cover is selected from a group consisting of alumina, aluminum, aluminum nitride, composites of aluminum and silicon carbide, copper, copper-tungsten, cuvar, silvar, and alloys thereof.

* * * * *